United States Patent
Louise et al.

(10) Patent No.: US 9,404,777 B2
(45) Date of Patent: Aug. 2, 2016

(54) LOCATION METHOD FOR LOCATING A PARTIAL DISCHARGE EMISSION ZONE AND A DEVICE ASSOCIATED WITH SAID METHOD

(75) Inventors: Sebastien Louise, Choisy le Roi (FR); Gilbert Luna, Villepinte (FR)

(73) Assignee: Alstom Technology Ltd., Baden (CH)

( * ) Notice: Subject to any disclaimer, the term of this patent is extended or adjusted under 35 U.S.C. 154(b) by 712 days.

(21) Appl. No.: 13/704,572

(22) PCT Filed: Jun. 15, 2011

(86) PCT No.: PCT/EP2011/059947
§ 371 (c)(1),
(2), (4) Date: Dec. 14, 2012

(87) PCT Pub. No.: WO2011/157753
PCT Pub. Date: Dec. 22, 2011

(65) Prior Publication Data
US 2013/0090883 A1    Apr. 11, 2013

(30) Foreign Application Priority Data

Jun. 16, 2010  (FR) ...................................... 10 54772

(51) Int. Cl.
*G01R 31/12* (2006.01)
*G01D 18/00* (2006.01)
*G01R 31/02* (2006.01)

(52) U.S. Cl.
CPC .......... *G01D 18/008* (2013.01); *G01R 31/1227* (2013.01); *G01R 31/027* (2013.01)

(58) Field of Classification Search
CPC .......................... G01R 31/1227; G01D 18/008

USPC ....................................................... 702/58, 59
See application file for complete search history.

(56) References Cited

U.S. PATENT DOCUMENTS

| | | |
|---|---|---|
| 5,166,694 A | 11/1992 | Russell et al. |
| 5,703,564 A | 12/1997 | Begum et al. |
| 6,340,890 B1 * | 1/2002 | Bengtsson ......... G01R 31/1209 324/535 |

(Continued)

FOREIGN PATENT DOCUMENTS

| | | |
|---|---|---|
| EP | 0955550 A1 | 11/1999 |
| EP | 1 439 396 A2 | 7/2004 |

(Continued)

OTHER PUBLICATIONS

Portugues, I. et al. "RF-Based Partial Discharge Early Warning System for Air-Insulated Substation", IEEE Transactions on Power Delivery, Jan. 1, 2009, p. 20-29, vol. 24, No. 1, IEEE Service Center, New York, NY, US.*

(Continued)

*Primary Examiner* — Gregory J Toatley
*Assistant Examiner* — Terence Stifter, Jr.
(74) *Attorney, Agent, or Firm* — Nixon Peabody LLP; Khaled Shami

(57) ABSTRACT

A method of locating a partial discharge emission zone and to the associated device. The method is characterized in that it comprises a step of measuring partial discharge signals by means of four identical measurement channels each including a VHF and/or UHF detector, the four VHF and/or UHF detectors being positioned at the four vertices of a square or rectangle in such a manner that the partial discharge emission zone is determined inside the square or rectangle.

5 Claims, 4 Drawing Sheets

(56) References Cited

U.S. PATENT DOCUMENTS

| | | | |
|---|---|---|---|
| 2005/0243649 A1* | 11/2005 | Kuppuswamy et al. | 367/118 |
| 2009/0119035 A1 | 5/2009 | Younsi et al. | |
| 2010/0079148 A1* | 4/2010 | Park | G01R 31/1254 324/536 |
| 2012/0143533 A1 | 6/2012 | Luna et al. | |
| 2014/0239969 A1 | 8/2014 | Lebreton et al. | |

FOREIGN PATENT DOCUMENTS

| | | |
|---|---|---|
| WO | 2011/051910 A1 | 5/2011 |
| WO | 2011/157753 A1 | 12/2011 |
| WO | 2013/041566 A1 | 3/2013 |
| WO | 2013/131948 A1 | 9/2013 |

OTHER PUBLICATIONS

International Search Report for PCT/EP2011/059945 dated Jun. 16, 2010.
Portugues, I. et al "RF-Based Partial Discharge Early Warning System for Air-Insulated Substations", IEEE Transactions on Power Delivery, Jan. 1, 2009, pp. 20-29, vol. 24, No. 1, IEEE Service Center, New York, NY, US.
Moore, P. et al "Radiometric Location of Partial Discharge Sources on Energized High-Voltage Plant", IEEE Transactions on Power Delivery, Jul. 1, 2005, pp. 2264-2272, vol. 20, No. 3, IEEE Service Center, New York, NY, US.
Stewart, B.G. et al "Triangulation and 3D Location Estimation of RFI and Partial Discharge Sources Within a 400kV Substation", Electrical Insulation Conference, 2009, IEEE, May 1, 2009, pp. 164-168, IEEE, Piscataway, NJ, USA.
Borghetto, J. et al., "Partial Discharge Inference by an Advanced System. Analysis of Online Measurements Performed on Hydrogenerator", IEEE Transactions on Energy Conversion, IEEE Service Center, Piscataway, NJ, US, vol. 19, Issue 2, Jun. 1, 2004, pp. 333-339.
Cavallini, A. et al., "A new approach to diagnosis of solid insulation systems based on PO signal inference", IEEE Electrical Insulation Magazine, IEEE Service Center, New York, NY, US, vol. 11, Issue 2, Mar. 1, 2003, pp. 23-30.
Contin, A. et al., "Digital detection and fuzzy classification of partial discharge signals", IEEE Transactions on Dielectrics and Electrical Insulation, vol. 9, Issue 3, Jun. 1, 2002, pp. 335-348.
Luo, R. et al., "Study on Partial Discharge Localization by Ultrasonic Measuring in Power Transformer Based on Particle Swarm Optimization", 2008International Conference on High Voltage Engineering and Application, ICHVE, Nov. 9-13, 2008, pp. 600-603.
Montanari, G.C. et al., "A new approach to partial discharge testing of HV cable systems", IEEE Electrical Insulation Magazine, IEEE Service Center, New York, NY, US, vol. 11, Issue 1, Jan. 1, 2006, pp. 14-23.
Sahoo, N.C. et al., "Trends in partial discharge pattern classification: a survey", IEEE Transactions on Dielectrics and Electrical Insulation, vol. 12, Issue 2, Apr. 11, 2005, pp. 248-264.
Strachan, S.M. et al., "Knowledge-based diagnosis of partial discharges in power transformers", IEEE Transactions on Dielectrics and Electrical Insulation, IEEE Service Center, Piscataway, NJ, US, vol. 15, Issue 1, Feb. 1, 2008, pp. 259-268.
Tsui, J. et al, "Basic GPS Concept" Fundamentals of Global Positioning System Receivers: A Software Approach, Chapter Two, Jan. 27, 2005, pp. 7-31.
Win, Su Su et al., "Partial Discharge Detection and Localization in Power Transformers", 8th International Conference on Electrical Engineering/Electronics, Computer, Telecommunications and Information Technology (ECTI-CON), May 17-19, 2011, pp. 673-676.
PCT International Search Report and Written Opinion in Application No. PCT/EP2013/054489, mailed on Apr. 5, 2013.
PCT International Preliminary Report on Patentability in Application No. PCT/EP2013/054489, mailed on Mar. 18, 2014.
PCT International Search Report and Written Opinion in Application No. PCT/EP2012/068441, mailed on Oct. 23, 2012.
PCT International Preliminary Report on Patentability in Application No. PCT/EP2012/068441, mailed on Apr. 3, 2014.
PCT International Preliminary Report on Patentability in Application No. PCT/EP2011/059947, mailed on Jan. 3, 2013.
French Search Report in French Patent Application No. FR1252152, mailed on Nov. 29, 2012.

* cited by examiner

US 9,404,777 B2

LOCATION METHOD FOR LOCATING A PARTIAL DISCHARGE EMISSION ZONE AND A DEVICE ASSOCIATED WITH SAID METHOD

CROSS REFERENCE TO RELATED APPLICATIONS OR PRIORITY CLAIM

This application is a National Phase of PCT/EP2011/059947, filed Jun. 15, 2011, entitled, "METHOD FOR LOCATING A PARTIAL DISCHARGE TRANSMISSION AREA AND ASSOCIATED DEVICE", which claims the benefit of French Patent Application No. 10 54772, filed Jun. 16, 2010, the contents of which are incorporated herein by reference in their entirety.

TECHNICAL FIELD AND PRIOR ART

The invention relates to a method of locating a partial discharge emission zone and to a locating device that is suitable for implementing the method.

Partial discharge measurements are performed, in the factory, on power transformers so as to ensure that they are functioning correctly. Depending on the conditions of the surrounding environment, partial discharge measurements may sometimes be disturbed by the presence of interfering discharges coming from electricity sources external to the transformers. The problem thus arises of how to locate those interfering discharges so as to be able to eliminate them.

Various techniques are known from the prior art for locating external discharges.

A first known location technique uses an ultrasonic detector. A first problem encountered by the use of an ultrasonic detector is its sensitivity to disturbances other than those caused by discharges. A second problem is the considerable time period that may be required to locate the source of a partial discharge when said source is situated on a large site.

A second known technique uses an ultra-violet camera. A first problem encountered by the use of an ultra-violet camera is that it is not possible to locate solely discharges that ionize air (corona discharges). Another drawback of that technique is its very high cost.

For both of the above-mentioned prior art techniques, it is also necessary for the discharge activity to be continuous and not sporadic because, otherwise, the detection of discharges is very highly random. That represents another drawback.

The method of the invention does not present the above-mentioned drawbacks.

SUMMARY OF THE INVENTION

The invention relates to a method of locating a partial discharge emission zone, characterized in that it includes:
- a step of calibrating four substantially identical measurement channels, each including a very high frequency (VHF) detector and/or ultra high frequency (UHF) detector, the step of calibrating providing, for each measurement channel, a calibration data associated with the measurement channel;
- a step of measuring partial discharge signals by means of the four measurement channels, the four VHF and/or UHF detectors being positioned in an (X, Y) plane, a detector D1 is placed at point (0, 0), a detector D2 at point (0, $Y_2$), a detector D3 at point ($X_3$, $Y_2$), and a detector D4 at point (0, $X_3$);
- a step of calculating a time difference $TOA_{D2}-TOA_{D3}$, corrected using the calibration data resulting from the calibration step, between the reception times of the signals measured by the measurement channels including the detectors D2 and D3, respectively;
- a step of calculating a time difference $TOA_{D4}-TOA_{D1}$, corrected using the calibration data resulting from the calibration step, between the reception times of the signals measured by the measurement channels including the detectors D4 and D1, respectively;
- a step of calculating a time difference $TOA_{D1}-TOA_{D2}$, corrected using the calibration data resulting from the calibration step, between the reception times of the signals measured by the measurement channels including the detectors D1 and D2, respectively;
- a step of calculating a time difference $TOA_{D3}-TOA_{D4}$, corrected using the calibration data resulting from the calibration step, between the reception times of the signals measured by the measurement channels including the detectors D3 and D4, respectively; and
- a step of locating a partial discharge emission zone at the intersection of the straight lines $X_{d1}$, $X_{d2}$, $Y_{d1}$, and $Y_{d2}$, defined in the (X, Y) frame of reference by the following equations:

$$X_{d1}=(X_3/2)+((TOA_{D2}-TOA_{D3})/2)\times c$$

$$X_{d2}=(X_4/2)-((TOA_{D4}-TOA_{D1})/2)\times c$$

$$Y_{d1}=(Y_2/2)+((TOA_{D1}-TOA_{D2})/2)\times c$$

$$Y_{d2}=(Y_3/2)-((TOA_{D3}-TOA_{D4})/2)\times c$$

where c is the speed of light.

In an improvement of the invention, the method includes two additional measurement channels that are substantially identical to the four measurement channels, the two additional detectors D5 and D6 of the two additional measurement channels being positioned in a plane that is parallel to the (X, Y) plane, vertically offset relative to the detectors D1 and D2, respectively. It is therefore possible to determine an additional discharge emission zone by means of the four detectors D1, D2, D5 and D6, in a (Y, V) plane, the axes X, Y, V defining a right-handed system of axes [X, Y, V].

Thus, when the plane partial discharge emission zones are simultaneously located in the respective planes (X, Y) and (Y, V), the method of the invention makes it possible to determine whether there exists a partial discharge emission zone in the form of a volume having projections onto the (X, Y) and (Y, V) planes that constitute the determined plane emission zones.

BRIEF DESCRIPTION OF THE DRAWINGS

Other characteristics and advantages of the invention appear more clearly in the following description, made with reference to the accompanying figures, in which.

In all of the figures, the same elements have the same references.

DETAILED DESCRIPTION OF A PREFERRED EMBODIMENT OF THE INVENTION

Figure 1:
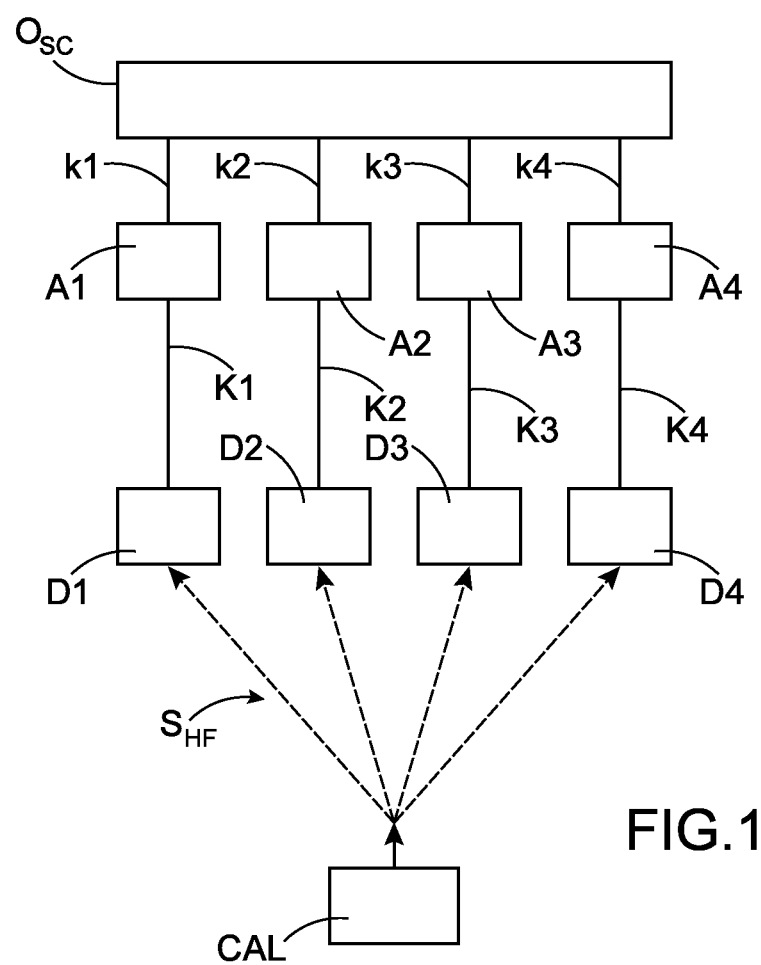
FIG. 1 shows a device that is suitable for implementing a preliminary calibration step necessary for implementing the method of the invention.

FIG. 1 shows a device that is suitable for implementing a preliminary calibration step necessary for implementing the method of the invention.

As described below on reading the preferred embodiment of the invention, four measurement channels are used to implement the method of the invention. Each measurement channel is constituted, for example, by a high-frequency detector $D_i$ (e.g. a UHF detector), a long coaxial cable $K_i$, an amplifier $A_i$ and a short coaxial cable $k_i$. By way of example, the long coaxial cable $K_i$ has a length in the range 5 meters (m) to 50 m and the short coaxial cable has a length that is substantially equal to 1 m. Other cable configurations between the detector $D_i$ and the amplifier $A_i$ are also possible, the cable configurations depending solely on convenience. The high-frequency detector operates, for example, in the UHF frequency band at 300 megahertz (MHz) to 1000 MHz. The high-frequency detector may also operate in a VHF/UHF frequency band, e.g. the 200 MHz-1000 MHz band. The VHF/UHF detectors selected are of the omnidirectional type so as to be able to detect discharges in all directions.

The detectors Di and the amplifiers Ai of the various measurement channels are selected to be identical from one measurement channel to another. In addition, the lengths of the various cables are selected to be identical from one measurement channel to another. The calibration step consists in sending a high-frequency signal $S_{HF}$ to the four UHF detectors from an impulse calibrator CAL (emitting a signal having a rising front of a few picoseconds that excites waves in the 200 MHz-1000 MHz frequency band). An oscilloscope $O_{SC}$ then measures the received electrical signal as a function of time at the end of each measurement channel. The oscilloscope is triggered by one of the four detected signals and the time differences between the various signals are measured. The measurement channels are adjusted (cable length, amplification) until the times differences measured do not exceed a threshold value, e.g. equal to 5 nanoseconds. The measured time differences that are less than the threshold value are stored in memory for subsequent incorporation in the calculations (c.f. the data $d_{cal}$ with reference to FIG. 2).

Figure 2:
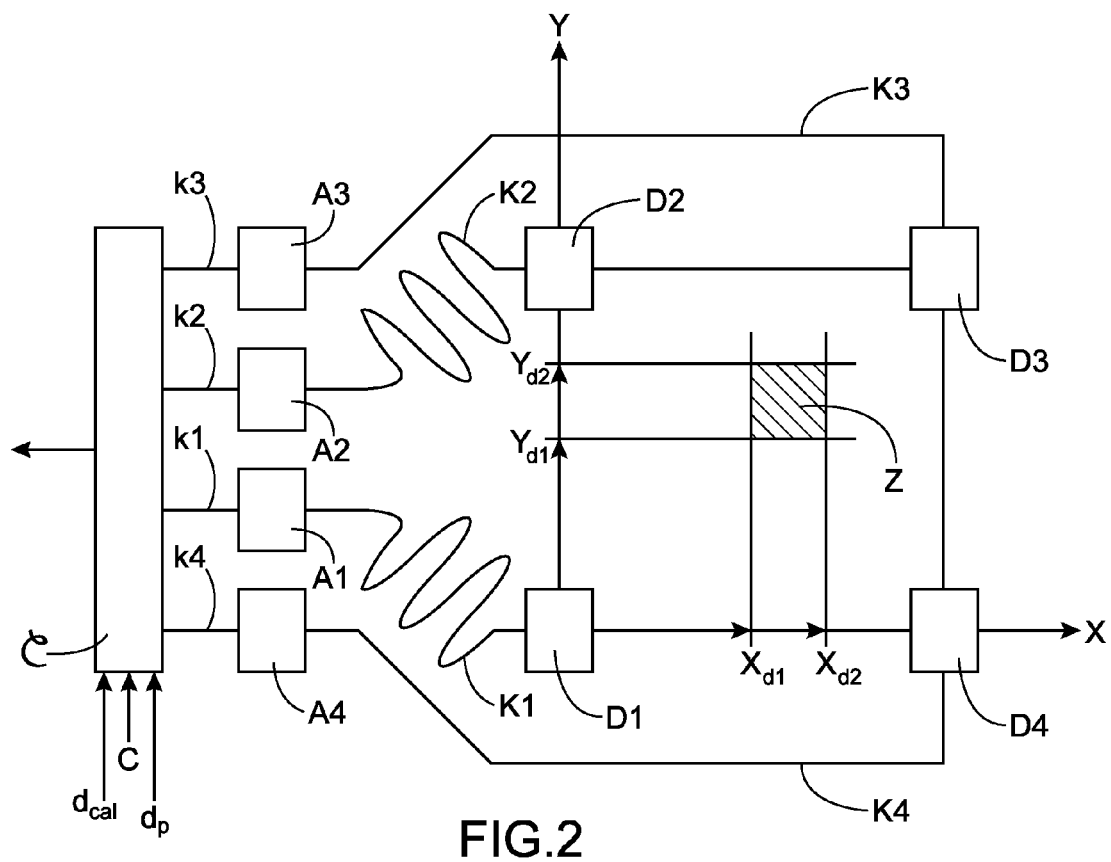
FIG. 2 shows an example of a device for implementing the method of the invention.
Figure 3A:
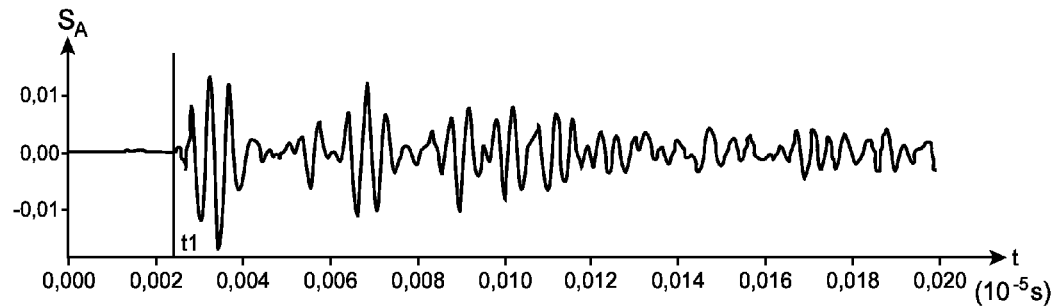
FIGS. 3A-3D show measuring signals delivered by the UHF detectors of the device shown in FIG. 2.
Figure 3B:
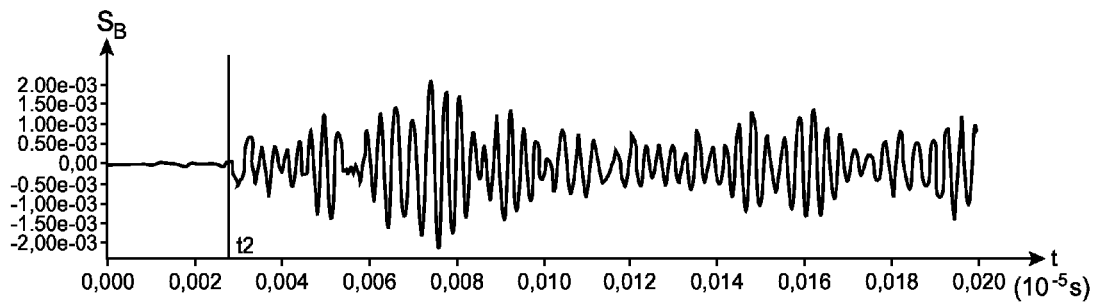
Figure 3C:
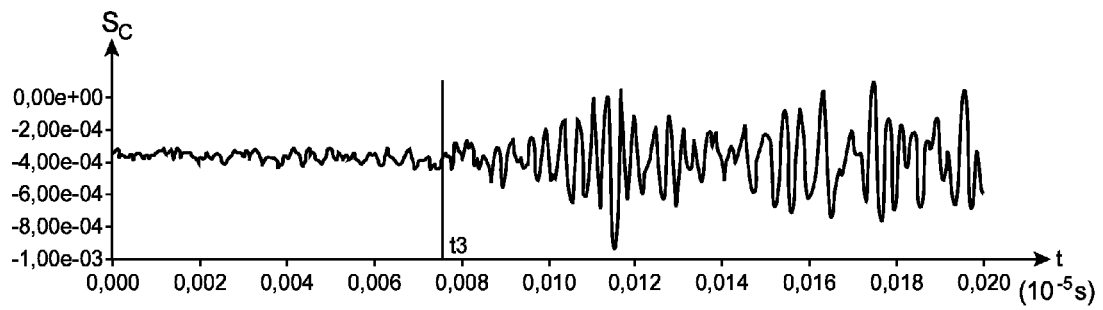
Figure 3D:
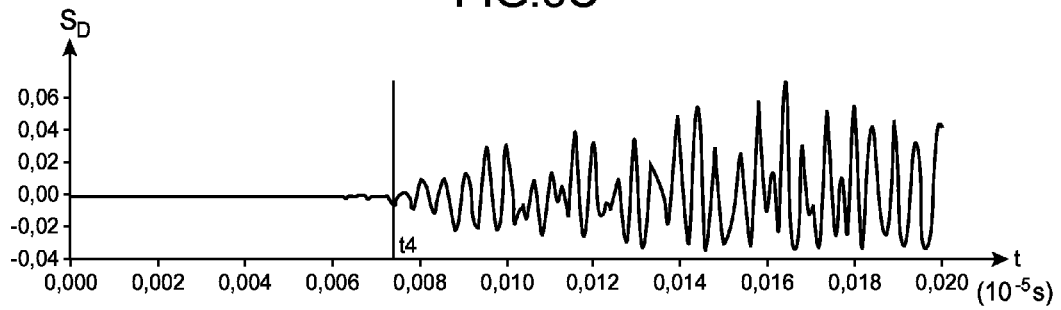

FIG. 2 shows a device for implementing the method of the invention. The four high-frequency detectors D1-D4 define a square or rectangular surface inside which a presumed partial discharge source is to be located. The measurement channels $D_i, K_i, A_i, k_i$ (i=1, 2, 3, 4) are all connected to a computer C or, as in the preliminary calibration step, to an oscilloscope. In the remainder of the description, reference is made exclusively to the measurement channels being connected to a computer. The computer C receives as input signals the signals delivered by the four measurement channels. It also receives, as calculation parameters, the previously-measured calibration data $d_{cal}$ and the position data $d_p$ that represent the known positions of the four detectors D1-D4 in a reference (X, Y) plane where, for example, the detector D1 is placed at point (0, 0), the detector D2 at point (0, $Y_2$), the detector D3 at point ($X_3, Y_3=Y_2$) and the detector D4 at the point ($X_4=X_3$, 0).

Whenever a partial discharge takes place in the zone defined by the four detectors, the signals measured by the four measurement channels are transmitted to the computer C. The computer C thus determines four time differences corrected by the calibration data $d_{cal}$ namely:

$TOA_{D2}-TOA_{D3}$: difference between the reception times of the signals detected by the measurement channels associated with the detectors D2 and D3, respectively;

$TOA_{D4}-TOA_{D1}$: difference between the reception times of the signals detected by the measurement channels associated with the detectors D4 and D1, respectively;

$TOA_{D1}-TOA_{D2}$: difference between the reception times of the signals detected by the measurement channels associated with the detectors D1 and D2, respectively; and $TOA_{D3}-TOA_{D4}$: difference between the reception times of the signals detected by the measurement channels associated with the detectors D3 and D4, respectively.

The zone Z from which the partial discharges are emitted is thus defined by the horizontal straight lines $X_{d1}$ and $X_{d2}$ and the vertical straight lines $Y_{d1}$ and $Y_{d2}$ as defined in the (X, Y) frame of reference by the following equations:

$$X_{d1}=(X_3/2)+((TOA_{D2}-TOA_{D3})/2)\times c$$

$$X_{d2}=(X_3/2)-((TOA_{D4}-TOA_{D1})/2)\times c$$

$$Y_{d1}=(Y_2/2)+((TOA_{D1}-TOA_{D2})/2)\times c$$

$$Y_{d2}=(Y_2/2)-((TOA_{D3}-TOA_{D4})/2)\times c$$

Where c is the speed of light in free air ($3\times10^8$ meters per second (m/s)).

In the preferred embodiment of the invention, the computer C includes a display device that displays on a screen the zone Z defined by the four straight lines $X_{d1}, X_{d2}, Y_{d1}$, and $Y_{d2}$.

When the partial discharge source is situated substantially at the center of the rectangle or square defined by the position of the four UHF detectors, the zone Z is a zone that is substantially a point that is situated substantially at the center of the rectangle. When the partial discharge source is not at the center of the rectangle, the zone Z is an area of greater or lesser extent that is not centered in the rectangle.

In advantageous manner, when searching for partial discharge in a building of large dimensions (typically 30 m×30 m) where the UHF detectors are placed in the four corners of the hangar, in general a side of the zone Z does not exceed a few meters. Thus, it is generally easy to locate visually the exact position of the partial discharge source in the determined zone Z. When visual location is not possible, the zone Z occupying a small extent, the use of an ultrasonic detector oriented towards the zone Z also enables the discharge source to be located rapidly.

In an example, FIGS. 3A-3D show measuring signals $S_A$-$S_D$ delivered by the measurement channels of the device of the invention that are associated with detectors D1-D4, respectively. In FIGS. 3A-3D, the times t1-t4 thus show various times where a single partial discharge is detected by the detectors D1-D4, respectively.

Figure 4:
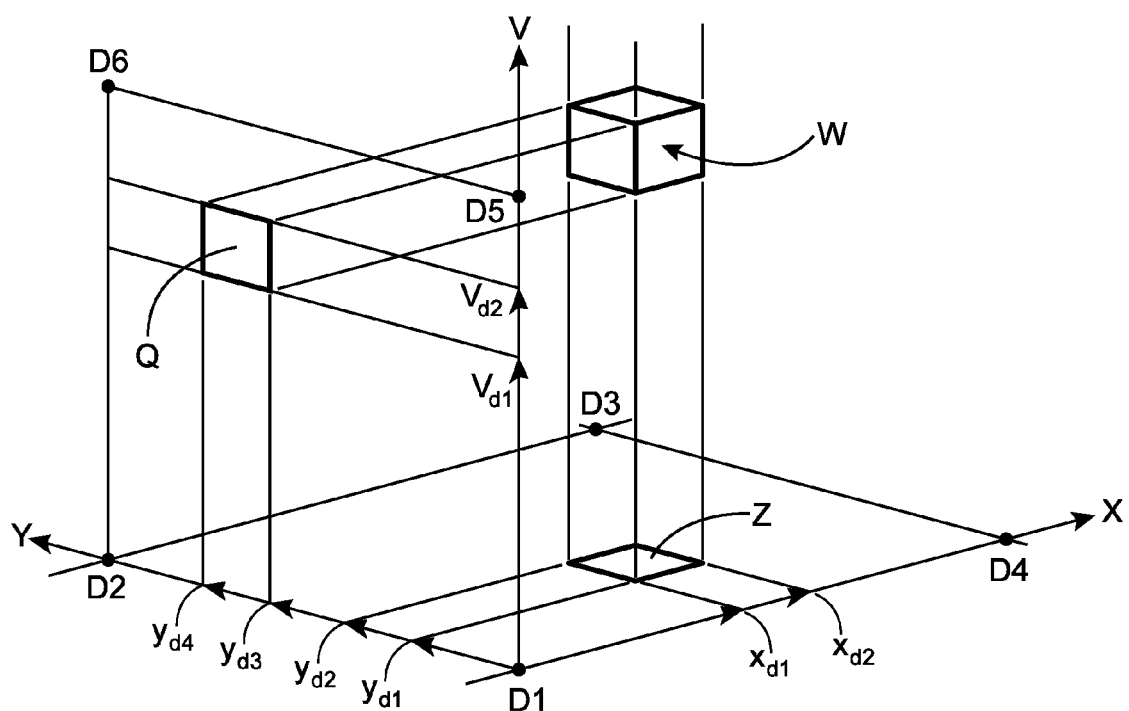
FIG. 4 shows an improvement of the device shown in FIG. 2.

FIG. 4 shows an improved device for implementing the method of the invention. In the improved device, the device of the invention includes six measurement channels. In addition to the four above-mentioned measurement channels, two additional measurement channels that are substantially identical to the above-mentioned four measurement channels are associated with two additional UHF detectors D5 and D6. As already mentioned above, each measurement channel includes a high-frequency detector, e.g. a long coaxial cable, an amplifier, and for example, a short coaxial cable. For reasons of convenience, only the detectors D1-D6 are shown in FIG. 4.

The two additional detectors D5 and D6 are situated vertically above the detectors D1 and D2, respectively, in a plane parallel to the plane defined by the detectors D1-D4. In the same manner as the detectors D1-D4 make it possible to define the (X, Y) plane, the detectors D1, D2, D5, D6 make it possible to define a (Y, V) plane that is perpendicular to the (X, Y) plane. The axes X, Y, V thus define a right-handed system of axes [X, Y, V]. The positions of the detectors D1, D2, D5, and D6 in the (Y, V) frame of reference are such that the detector D1 is placed at the point (0, 0), the detector D2 at the point ($Y_2$, 0), the detector D5 at the point (0, $V_5$), and the detector D6 at the point ($Y_6=Y_2$, $V_6=V_5$).

As mentioned above, the detectors D1-D4 make it possible to define, in the (X, Y) frame of reference, a plane zone Z at the intersection of the straight lines having respective equations:

$$X_{d1}=(X_3/2)+((TOA_{D2}-TOA_{D3})/2)\times c$$

$$X_{d2}=(X_3/2)-((TOA_{D4}-TOA_{D1})/2)\times c$$

$$Y_{d1}=(Y_2/2)+((TOA_{D1}-TOA_{D2})/2)\times c$$

$$Y_{d2}=(Y_2/2)-((TOA_{D3}-TOA_{D4})/2)\times c$$

In the improvement of the invention, the detectors D1, D2, D5 and D6 also make it possible to define, in the (Y, V) frame of reference, a plane zone Q at the intersection of the straight lines having respective equations:

$$Y_{d3}=(Y_2/2)+((TOA_{D5}-TOA_{D6})/2)\times c$$

$$Y_{d4}=(Y_2/2)-((TOA_{D2}-TOA_{D1})/2)\times c$$

$$V_{d1}=(V_5/2)+((TOA_{D1}-TOA_{D5})/2)\times c$$

$$V_{d2}=(V_5/2)-((TOA_{D6}-TOA_{D2})/2)\times c$$

where $TOA_{D5}-TOA_{D6}$ is the time difference, corrected using the calibration data, between the reception times of the signals detected by the measurement channels associated with the detectors D5 and D6, respectively;

$TOA_{D2}-TOA_{D1}$ is the time difference, corrected using the calibration data, between the reception times of the signals detected by the measurement channels associated with the detectors D2 and D1, respectively;

$TOA_{D1}-TOA_{D5}$ is the time difference, corrected using the calibration data, between the reception times of the signals detected by the measurement channels associated with the detectors D1 and D5, respectively; and $TOA_{D6}-TOA_{D2}$ is the time difference, corrected using the calibration data, between the reception times of the signals detected by the measurement channels associated with the detectors D6 and D2, respectively.

It is thus possible to define, in the right-handed system of axes [X, Y, Z], a volume W having a projection on the (X, Y) plane that occupies the area Z and having a projection on the (Y, V) plane that occupies the area Q. The volume W therefore locates the source of the partial discharge.

The invention claimed is:

1. A method of locating a partial discharge emission zone (Z), characterized in that it includes:
    a step of calibrating four substantially identical measurement channels, each including a very high frequency (VHF) detector and/or an ultra high frequency (UHF) detector (D1-D4), the step of calibrating providing, for each measurement channel, a calibration data ($d_{cal}$) associated with the measurement channel;
    a step of measuring partial discharge signals by means of the four measurement channels, the four VHF and/or UHF detectors being positioned in an (X, Y) plane, a detector D1 is placed at point (0, 0), a detector D2 at point (0, $Y_2$), a detector D3 at point ($X_3$, $Y_2$), and a detector D4 at point (0, $X_3$);
    a step of calculating a time difference $TOA_{D2}-TOA_{D3}$ between the reception times of the signals measured by the measurement channels associated with the detectors D2 and D3, respectively, said step of calculating being corrected using the calibration data;
    a step of calculating a time difference $TOA_{D4}-TOA_{D1}$ between the reception times of the signals measured by the measurement channels associated with the detectors D4 and D1, respectively, said step of calculating being corrected using the calibration data;
    a step of calculating a time difference $TOA_{D1}-TOA_{D2}$ between the reception times of the signals measured by the measurement channels associated with the detectors D1 and D2, respectively, said step of calculating being corrected using the calibration data;
    a step of calculating a time difference $TOA_{D3}-TOA_{D4}$ between the reception times of the signals detected by the measurement channels associated with the detectors D3 and D4, respectively, said step of calculating being corrected using the calibration data; and
    a step of determining the partial discharge emission zone at the intersection of the straight lines $X_{d1}$, $X_{d2}$, $Y_{d1}$, and $Y_{d2}$ defined in the (X, Y) frame of reference by the following equations:

$$X_{d1}=(X_3/2)-((TOA_{D2}-TOA_{D3})/2)\times c$$

$$X_{d2}=(X_3/2)-((TOA_{D4}-TOA_{D1})/2)\times c$$

$$Y_{d1}=(Y_2/2)+((TOA_{D1}-TOA_{D2})/2)\times c$$

$$Y_{d2}=(Y_2/2)-((TOA_{D3}-TOA_{D4})/2)\times c$$

wherein $X_{d1}$ and $X_{d2}$ are intersection points on the X-axis of vertical straight lines bounding the partial discharge emission zone, and $Y_{d1}$ and $Y_{d2}$ are intersection points on the Y-axis of horizontal straight lines bounding the partial discharge emission zone, and
    wherein c is the speed of light.

2. A method according to claim 1 that further includes:
    during the calibration step, an additional step of calibrating two additional measurement channels that are substantially identical to the four measurement channels, the additional step of calibrating providing, for each additional measurement channel, an additional calibration data ($d_{cal}$) associated with the additional measurement channel;
    two additional steps of measuring partial discharge signals by means of the two additional measurement channels, the two additional detectors D5 and D6 of the two additional measurement channels being positioned in a plane that is parallel to the (X, Y) plane, vertically offset relative to the detectors D1 and D2, respectively;
    a step of calculating a time difference $TOA_{D5}-TOA_{D6}$ between the reception times of the signals measured by the measurement channels associated with the detectors D5 and D6, respectively, said step of calculating being corrected using the additional calibration data;
    an additional step of calculating a time difference $TOA_{D1}-TOA_{D5}$ between the reception times of the signals measured by the measurement channels associated with the detectors D1 and D5, respectively, said step of calculating being corrected using the additional calibration data;
    a step of calculating a time difference $TOA_{D6}-TOA_{D2}$ between the reception times of the signals measured by the measurement channels associated with the detectors D6 and D2, respectively, said step of calculating being corrected using the additional calibration data; and a step of determining a plane zone (Q) at the intersection of the straight lines defined in the equations:

$$Y_{d3}=(Y_6/2)+((TOA_{D5}-TOA_{D6})/2)\times c$$

$$Y_{d4}=(Y_2/2)-((TOA_{D2}-TOA_{D1})/2)\times c$$

$$V_{d1}=(V_5/2)+((TOA_{D1}-TOA_{D5})/2)\times c$$

$$V_{d2}=(V_6/2)-((TOA_{D6}-TOA_{D2})/2)\times c$$

wherein $Y_6$ and $V_6$ are, respectively, the position of the detector D6 in a (Y, V) frame of reference that is perpendicular to the (X, Y) frame of reference, the axes X, Y, V defining a right-handed system of axes [X, Y, V], and $V_5$ being the position of the detector $D_5$ in the (Y, V) frame of reference, and wherein $Y_{d3}$ and $Y_{d4}$ are intersection points on the Y-axis of straight lines parallel to the V-axis and bounding the plane zone (Q) in the (Y,V) frame, and $V_{d1}$ and $V_{d2}$ are intersection points on the V-axis of straight lines parallel to the Y-axis and bounding the plane zone (Q) in the (Y,V) frame.

3. A method according to claim 2, wherein, whenever the partial discharge emission zone and the additional partial discharge zone are simultaneously determined, it is verified whether or not there exists a three-dimensional volume (W), said volume having on the (X, Y) plane a projection defined by the emission zone and having a projection on the (Y, V) plane defined by the additional emission zone and, if said volume exists it is determined as being the partial discharge zone.

4. A device for locating a partial discharge emission zone (Q), characterized in that the detectors D1-D4 are positioned at the four vertices of a square or rectangle outlined in the plane referenced (X, Y), the device further including a computer (C) that determines the location of the emission zone in accordance with the method of claim 1.

5. A device according to claim 4, further including two additional measurement channels that are substantially identical to the four measurement channels, the two additional detectors D5 and D6 of the two additional measurement channels being positioned in a plane that is parallel to the (X, Y) plane, vertically offset relative to the detectors D1 and D2, respectively, the two additional measurement channels being connected to the computer (C).

* * * * *